United States Patent [19]
Norton et al.

[11] Patent Number: 5,859,424
[45] Date of Patent: Jan. 12, 1999

[54] APODIZING FILTER SYSTEM USEFUL FOR REDUCING SPOT SIZE IN OPTICAL MEASUREMENTS AND OTHER APPLICATIONS

[75] Inventors: Adam E. Norton, Palo Alto; Kenneth C. Johnson, Santa Clara; Joseph R. Carter, San Jose, all of Calif.

[73] Assignee: KLA-Tencor Corporation, San Jose, Calif.

[21] Appl. No.: 835,533

[22] Filed: Apr. 8, 1997

[51] Int. Cl.$^6$ .................................................... G01J 3/50
[52] U.S. Cl. .................... 250/226; 250/216; 250/237 G; 359/888
[58] Field of Search ............................... 250/226, 237 G, 250/237 R, 559.04, 559.22, 201.2, 503.1, 492.2, 216; 356/225, 374, 381; 659/888, 738, 739

[56] References Cited

U.S. PATENT DOCUMENTS

| | | | |
|---|---|---|---|
| 4,030,817 | 6/1977 | Westell | 359/888 |
| 4,537,475 | 8/1985 | Summers et al. | |
| 5,159,412 | 10/1992 | Willenborg et al. | 356/445 |
| 5,166,752 | 11/1992 | Spanier et al. | 356/369 |
| 5,349,592 | 9/1994 | Andoó | 372/32 |
| 5,608,526 | 3/1997 | Piwonka-Corle et al. | 356/364 |

OTHER PUBLICATIONS

"Apodization for maximum encircled–energy ratio and specified Rayleigh limit," A. M. Clements et al., *Selected Papers on Apodization—Coherent Optical Systems*, SPIE Milestone Series, vol. MS 119, edited by J.P. Mills et al., pp. 49–53 (reprinted from *Journal of the Optical Society of America*, vol. 64(1), pp. 23–27, Jan. 1974).

"Performance of an opodized aperture in a defocused optical system under partially coherent illumination," K. Yamamoto et al., *Selected Papers on Apodization—Coherent Optical Systems*, SPIE Milestone Series, vol. MS 119, edited by J.P. Mills et al., pp. 189–210 (reprinted from *Optica Acta*, vol. 23 (12), pp. 965–986, Jan. 1976).

Image Formation: Coherent Optics, M. Klein et al., Chapter 7.3, pp. 444–500, Jan. 1986.

"Elements of the Theory of Diffraction," *Principals of Optics*, M. Born et al., 6th Edition, Chapter 8, pp. 370–458, Jan. 1980.

"Apodisation," P. Jacquinot, *Progress in Optics*, vol. III, Edited by E. Wolf, Chapter II, 1964, pp. 31–184, Jan. 1964.

*Silicon Processing for the VLSI Era*, S. Wolf et al., pp. 482–483 & 493–504, Jan. 1986.

*Primary Examiner*—Que Le
*Attorney, Agent, or Firm*—Majestic, Parsons, Siebert & Hsue P.C.

[57] ABSTRACT

Because of diffraction effects caused by slits or apertures in optical measurement systems, the radiation energy which is directed towards a particular region on a sample will be spread over a larger area than desirable. By employing an apodizing filter in the radiation path in such system, diffraction tails of the system will be reduced. The apodizing filter preferably has a pattern of alternating high transmittance areas and substantially opaque areas where the locally averaged transmittance function is an apodizing function. In the preferred embodiment, the locally averaged transmittance function varies smoothly and monotonically from the periphery to the center of the filter.

69 Claims, 7 Drawing Sheets

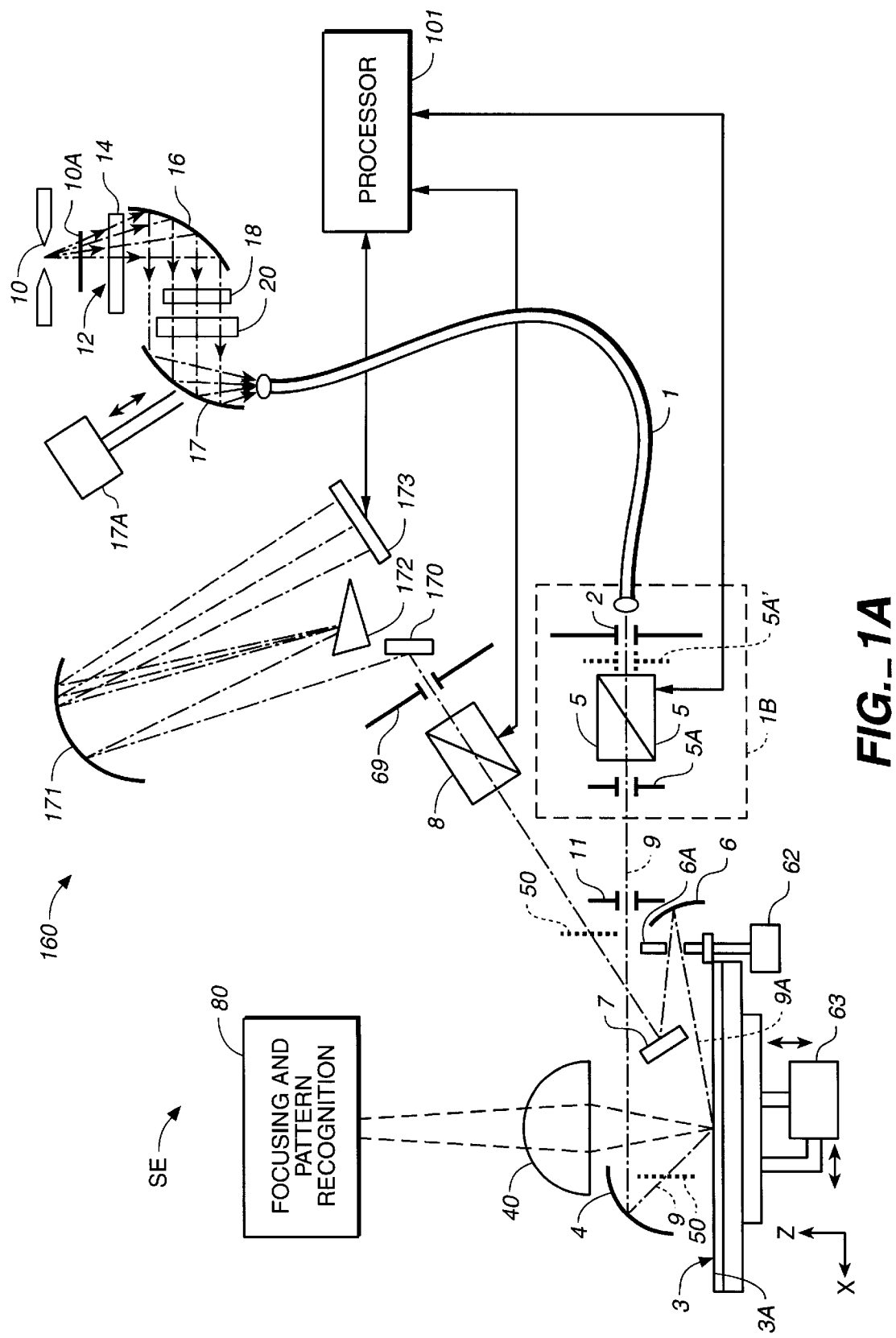
FIG._1A

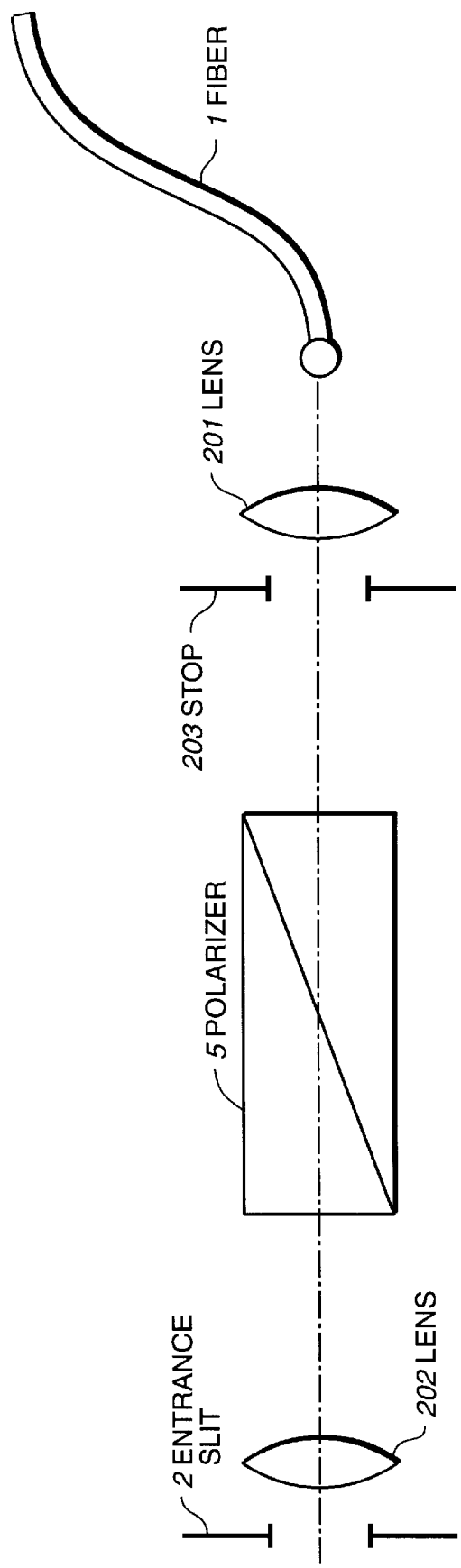
FIG._1B

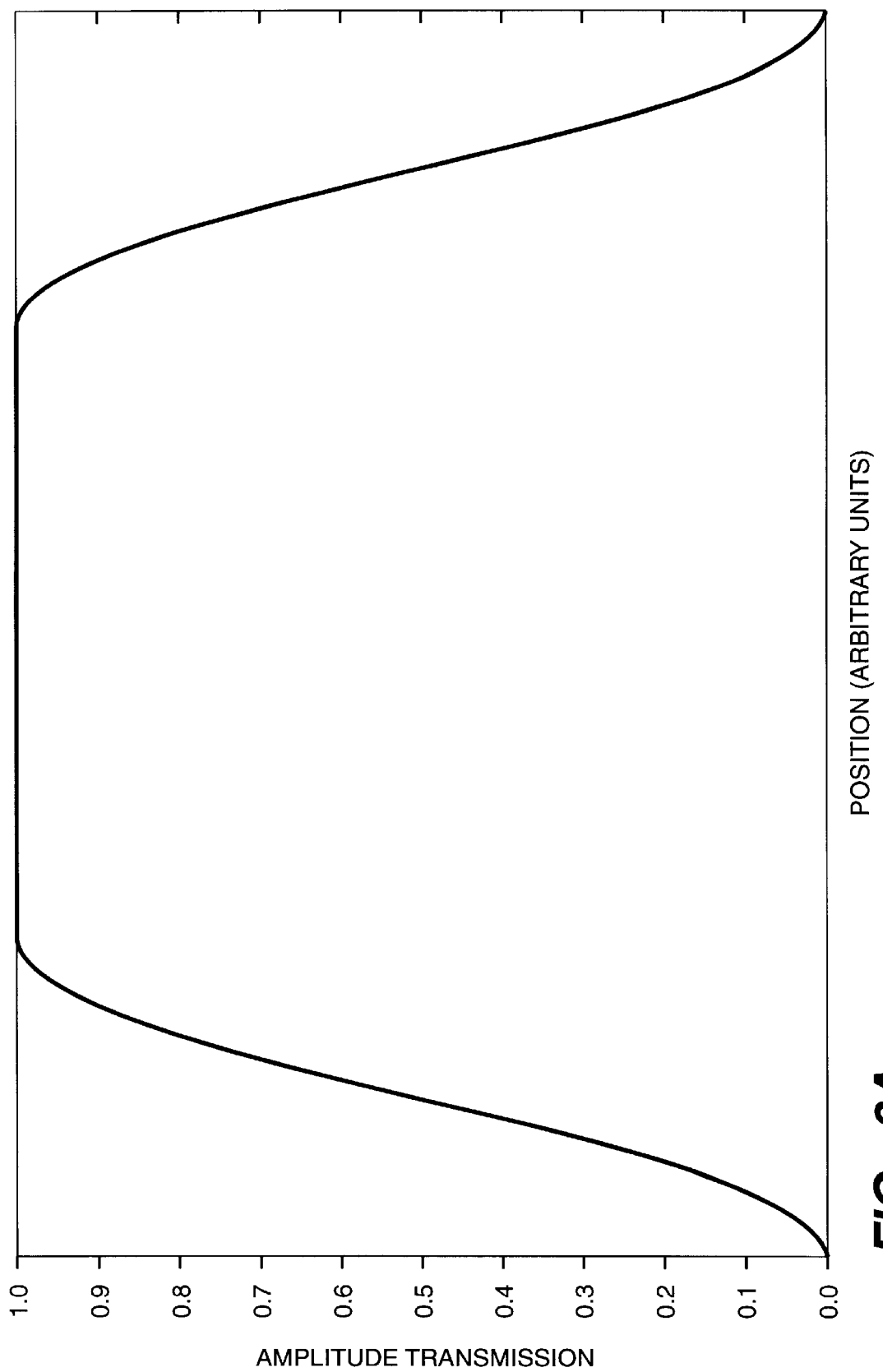
FIG._2A

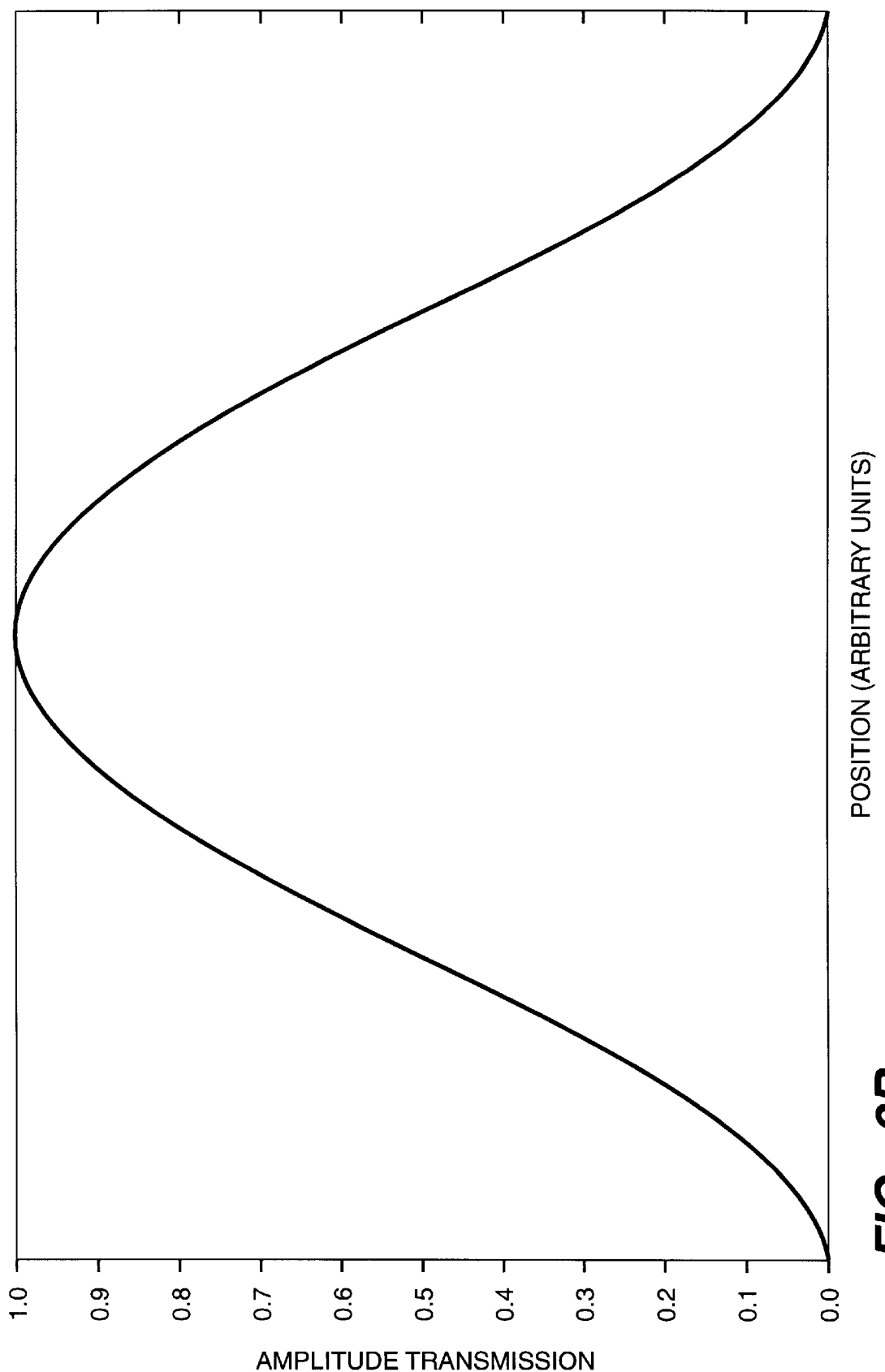
FIG._2B

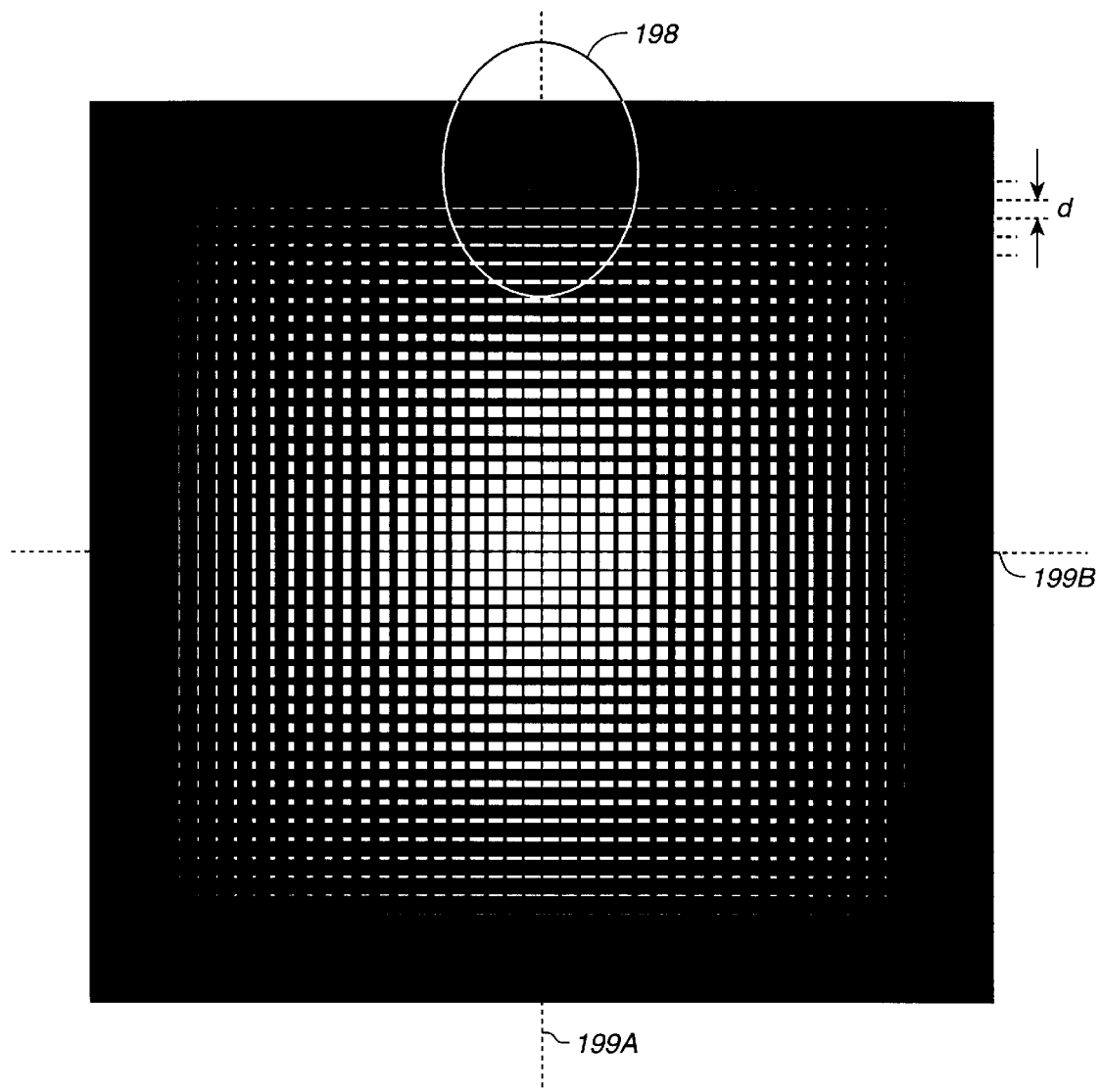
FIG._3

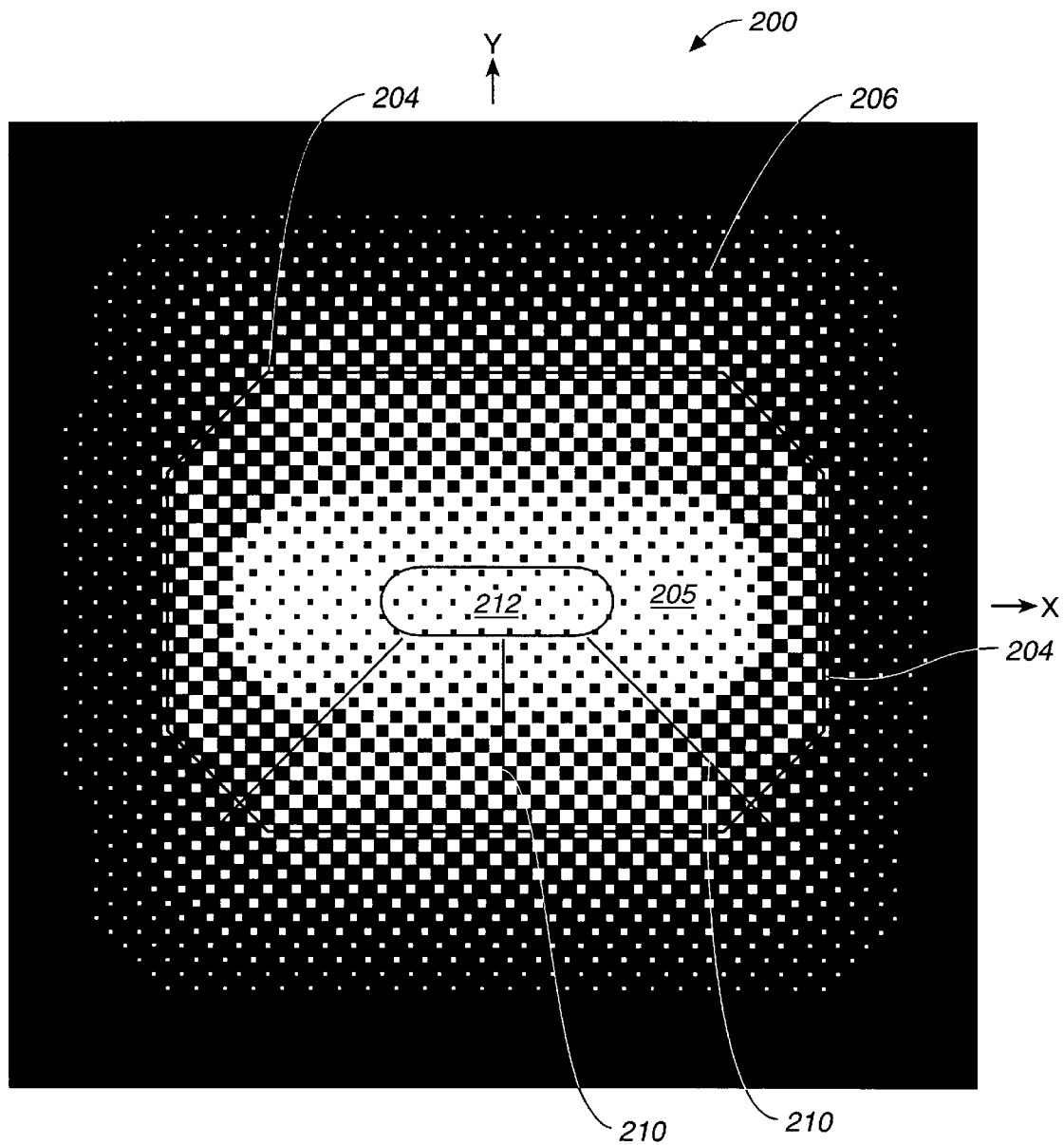
FIG._4

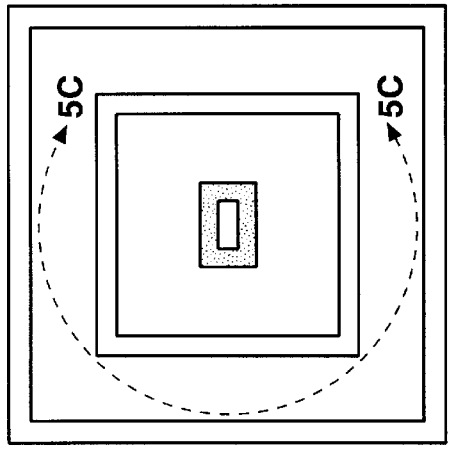
FIG._5B
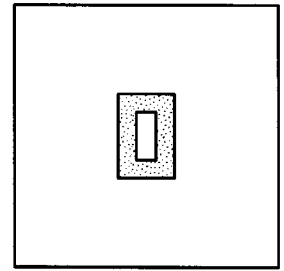
FIG._5C
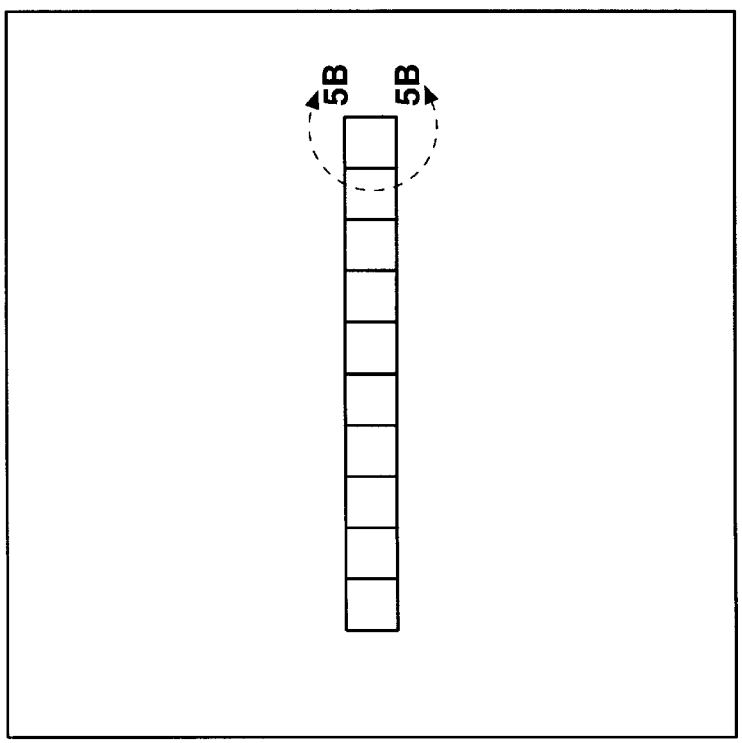
FIG._5A
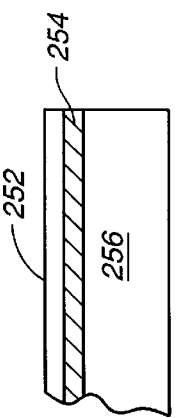
FIG._6

APODIZING FILTER SYSTEM USEFUL FOR REDUCING SPOT SIZE IN OPTICAL MEASUREMENTS AND OTHER APPLICATIONS

BACKGROUND OF THE INVENTION

This application relates in general to optical measurement systems and, in particular, an apodizing filter system for reducing spot size in optical measurements and for other applications.

Ellipsometers, spectrophotometers and similar optical instruments direct a beam of polarized or unpolarized radiation consisting of one or more wavelengths of electromagnetic radiation from the microwave, infrared, visible or ultraviolet regions of the spectrum at a sample which is to be measured. The reflected radiation, the transmitted radiation or both are collected and from the collected signal inferences are made about the material, or other, properties of the sample.

When the properties of the sample vary from place to place, it is usually necessary to illuminate (or alternatively, sense the signal from) only a small region of the sample to avoid the measurements of the region of interest being confused by the signal detected from the surrounding material of differing composition. An example of this is the measurement of the thickness of a thin film on a surface of a semiconductor wafer. For the measurement to be made on a wafer containing integrated circuits (a product wafer) rather than on a special test wafer, it is necessary to measure in the small area containing the film to be measured. In a modern integrated circuit, a feature that is to be measured may have dimensions which are only a few microns to a few tens of microns in size.

Focusing the illumination or detection system onto such a small area of a sample can be done using standard microscope technology when incident radiation consists only of visible light wavelength and is directed at normal or near normal incidence to the sample. It is well understood how to design a lens system for visible wavelengths to minimize chromatic and other aberrations to focus down to a spot of the order of a few microns. However, many optical instruments use angles of incidence very different from normal to enhance sensitivity. In particular, ellipsometers are typically aligned at an angle of incidence close to the Brewster's angle for the material of interest (about 75 degrees for silicon). In such cases, the high angle of incidence spreads the diffraction and aberration effects over a larger area. To a first approximation, the spot is spread over a distance 1/cos (incident angle) times the distance in the normal incidence case. Even when the incident light strikes the sample at near normal incidence, some applications require spot sizes that are about one micron or less in size. In these cases, as well as in the non-normal incidence case, aperture diffraction contributes significantly to the spot size and has to be minimized.

One common technique to reduce or alter the diffraction pattern of a small spot image is the pinhole spatial filter. In this technique, the light source is focused onto an aperture that is just slightly larger than the diffraction limited resolution of the focusing lens system. The light cone is allowed to expand to fill a second lens system that then forms the small spot image. The optical sub-system just described is commonly known as a pinhole spatial filter (see, for example, *Optics,* M. Klein and T. Furtak, chapter 7.3, J. Wiley & Sons, 1986).

The limitations of a pinhole spatial filter include the following:

(i) The light source must be focused onto the aperture to a spot that is small compared to the resolution of the first focusing lens system given the numerical aperture that is desired. In practice, this usually limits use of a pinhole spatial filter to laser light sources;

(ii) The pinhole aperture must be aligned to the image with extremely tight tolerances, and the alignment must be maintained over the life of the optical apparatus. This could be a problem in commercial instruments that must survive shipping and temperature fluctuations; and (iii) The first lens system must have good imaging qualities. Chromatic aberration precludes the use of a refractive lens when a broad band of wavelengths, especially UV to near IR, is used. A reflective lens system will tend to partially polarize the beam which is not desirable for an ellipsometer illuminator.

These limitations make it difficult to use a pinhole spatial filter in most broad-band optical systems, especially those that measure polarization.

SUMMARY OF THE INVENTION

This invention is based on the observation that by applying apodization to optical measurement systems such as ellipsometers and spectrophotometers or to imaging systems, the above-described difficulties are alleviated. One aspect of the invention is directed towards a method for measuring a sample, including the steps of focusing radiation from a source into a sampling beam directed at the sample; detecting radiation of the sampling beam that has been modified by a portion of the sample, said portion defining a measurement spot; and apodizing radiation that is from the source, wherein said detecting step detects radiation that has been apodized in the apodizing step, to reduce the size of the measurement spot.

Another aspect of the invention is directed towards an apparatus for measuring a sample, including a source which emits radiation; means for focusing radiation from the source into a sampling beam directed to the sample; and means for detecting radiation of the sampling beam that has been modified by a portion of the sample, said portion defining a measurement spot. The apparatus further includes means for apodizing radiation that is from the source, wherein said detecting means detects radiation that has been apodized by the apodizing means, to reduce size of the measurement spot.

Yet another aspect of the invention is directed towards an apodizing filter comprising a two-dimensional pattern of alternating high transmittance areas and substantially opaque areas, said pattern having a locally averaged transmittance function that is an apodizing function. The term "substantially opaque" is interpreted below.

The outside edge of the apodizing filter needs to be substantially opaque because at some point there will be a transition from that substantially opaque region to a completely opaque region (for example, a metal support for the optics). If the change in transmittance from the substantially opaque to completely opaque is too large, significant diffraction effects will occur reducing any benefit from the apodizing filter. The definition of "too large" will depend on the application, but most applications would require the substantially opaque region to transmit no more than about 10% of the incident radiation in order for the apodizing filter to significantly reduce diffraction effects in the instrument.

One more aspect of the invention is directed to a radiation imaging system with improved resolution, comprising means for focusing radiation from an object surface to a focal surface; and an apodizer positioned in a radiation path between the object surface and the focal surface, said apodizer having a two dimensional pattern of alternating high transmittance areas and substantially opaque areas, said pattern having a locally averaged transmittance function that is an apodizing function. The system further includes a filter in the radiation path following the apodizer, said filter blocking scattered radiation that is generated by the apodizer; wherein radiation transmitted through the apodizer and the filter along said radiation path comprises image radiation, said image radiation having a diffraction point spread function; wherein the apodizer reduces tails of the point spread function relative to that of an unapodized clear aperture.

BRIEF DESCRIPTION OF THE DRAWINGS

FIG. 1A is a part schematic and part block diagram of an optical measurement system useful for illustrating the invention.

FIG. 1B is a schematic diagram of an alternative polarizer assembly suitable for use with an apodizing filter in the arrangement in FIG. 1A to illustrate the preferred embodiment of the invention.

FIGS. 2A and 2B are graphical plots showing horizontal and vertical cross-sections of an apodizing filter's transmittance function to illustrate the preferred embodiment of the invention.

FIG. 3 is a front view of an apodizing filter to illustrate one embodiment of the invention.

FIG. 4 is a front view of another apodizing filter to illustrate the preferred embodiment of the invention.

FIGS. 5A, 5B and 5C are schematic views of a radiation transmissive material with a pattern of opaque layer formed thereon to illustrate a process for making apodizing filters.

FIG. 6 is a cross-sectional view of a portion of an apodizing filter to illustrate the preferred embodiment of the invention.

DETAILED DESCRIPTION OF THE PREFERRED EMBODIMENTS

The present invention discloses a method of applying apodization to imaging, ellipsometry, spectrophotometry and other optical measurement systems. This invention also discloses a design for apodizing filters and an effective method for manufacturing spatially-varying neutral density filters suitable for use as apodization filters.

FIG. 1A shows a schematic view of the optical components of a thin-film measurement system that includes a spectroscopic ellipsometer (SE). The broad-band near-UV, visible and near-IR light from a Xenon arc lamp 10 is focused by optics onto a fused-silica fiber 1. The output of this fiber (which has good uniformity and is unpolarized as a result of multiple reflections inside the fiber, as described in U.S. Pat. No. 5,329,357) is the source of light for the SE system. A slit or pinhole 2 in front of this fiber reduces the effective source size in the vertical direction (which will be imaged as the left-to-right direction on the sample, such as a wafer). The light passes through a polarizer 5 that is rotated at constant speed. The light which is undeviated by the polarizer is linearly polarized with a polarization vector that rotates at constant speed. The polarizer also produces a beam that is deviated. The deviated beam is polarized perpendicular to the undeviated beam. The polarizer aperture 5A is of such a size that there is no overlap between the undeviated and the deviated light at the location where the deviated beam is blocked. The undeviated beam of radiation is focused onto the sample 3 by the focus mirror 4. The minimum area on the sample that can be measured is determined by how well the radiation can be focused by this mirror, and by the angles of reflection of the light collected by the collection mirror 6, as described in detail in U.S. Pat. No. 5,608,526. In the two preferred embodiments just described, the polarizer aperture also functions as the aperture stop for the system, and diffraction from this aperture affects the image focused on the sample. In alternative preferred embodiments, a separate aperture stop could be placed near the blocking aperture 11 or near the focus mirror 4, and the polarizer aperture 5A would function solely to separate the deviated and undeviated beams of radiation. In the first preferred embodiment, aperture 5A is placed after the polarizer. In an alternative embodiment this aperture is placed before the polarizer, shown in dotted line 5A' in FIG. 1A.

A portion of the light reflected from the sample is collected by the collection mirror 6, which focuses that light onto the entrance slit 69 of the spectrometer. On its way to the spectrometer, the light is reflected from a fold mirror 7 (the fold mirror is not fundamental to the system design, but may be necessary to make the optics fit into some convenient volume), and passes through a computer controlled analyzer 8, which selects light of one polarization. The area of the sample focused by the collection mirror is larger than that illuminated by the focus mirror to simplify system alignment. The size of the polarizer aperture 5A and the layout of the optics are such that the deviated beam from the polarizer 5 does not reach, or is blocked by, the spectrometer entrance slit 69 and so does not contribute to the measured signal. Detector 173 of the spectrometer 160 measures the different wavelength components of radiation from the sample and provides phase and amplitude information to processor 101. Processor 101 analyzes such data to determine sample characteristics which can include the thicknesses and indices of refraction of films on the sample.

Because of the high angle of incidence of beam 9 (defined as the angle the illumination beam makes with the normal to the sample surface) on the sample, the image of the fiber slit formed by the focus mirror 4 cannot be completely in focus, and diffraction and other aberrations enlarge the image further. Preferably the angle of incidence is in the range of 63.5 to 80.5 degrees. To minimize the diffraction effects, the system includes at the polarizer aperture 5A, an apodizer which has a gradual, rather than sudden, transition from high to low transmittance. The shape of the transition is not too critical as long as it varies fairly smoothly from high transmittance at the center to substantially opaque at the edges. Other suitable filters are described below.

The *McGraw-Hill Dictionary of Scientific and Technical Terms,* 2nd Ed., 1985, by McGraw-Hill, Inc., defines "apodization" as "The modification of the amplitude transmittance of the aperture of an optical system so as to reduce or suppress the energy in the diffraction rings relative to that of the central Airy disk." This definition is applicable to circular apertures, but the technique applies equally well to other aperture shapes. The diffraction point spread function at an optical system's focal plane will not have the form of Airy pattern if the system's limiting aperture is non-circular, but it will generally exhibit tails extending far outside of the central diffraction peak due to diffraction at the aperture. See, for example, Chapter 8 of *Principles of Optics,* M. Born & E. Wolf, 6th Ed., (1980). The diffraction tails are associated with the high spatial frequency component of the aperture's two-dimensional transmittance profile. This high spatial frequency component originates primarily from the sharp transmittance discontinuities at the aperture edges, and the diffraction tails can be reduced by modifying the aperture's amplitude transmittance to mitigate these discontinuities. This method of reducing the diffraction tails defines apodization generally, and an aperture transmittance function which achieves this reduction is referred to herein as an "apodizing function" or "apodization function." Common apodization functions are truncated Gaussian profiles and cosine profiles. See also *Progress in Optics,* Ed. E. Wolf, J. Wiley and Sons, p. 29, 1964. Apodization has been widely applied in ultrasound devices to reduce diffraction effects, but applications of apodization in optical systems, particularly illumination and optical measurement systems, have been limited.

FIG. 2B illustrates a suitable apodization function for an apodizer. The amplitude transmittance varies from minimum to maximum and back to minimum following four quadrants of a cosine function. This shape is used in the preferred embodiment for the amplitude transmittance profile in the vertical dimension of the apodizing filter, where the vertical dimension of the filter corresponds to the incident plane (plane of the paper in FIG. 1A) of the illumination beam on the sample.

FIG. 2A illustrates another possible amplitude apodization function. In this case, the central half of the aperture dimension has constant maximum transmittance, and two quadrants of a cosine profile are used at each side to transition smoothly between minimum and maximum transmittance. This transmittance profile does not reduce the measurement spot size as much as the first, but it does transmit a larger fraction of the total incident radiation. In the preferred embodiment, this profile is used for the horizontal profile of the apodizing filter since this corresponds to the direction normal to the incidence plane on the sample. (The measurement spot size in this direction is smaller than in the incidence plane direction because it does not include the 1/cos (incidence angle) obliquity factor; and thus, the aperture does not need as much apodization in the horizontal direction.)

The apodizing filter 50 could be placed at any position along the light path between the entrance slit 2 of the illumination optics for the sample and the entrance slit 69 of the spectrometer. For example, it may be placed between slit 2 and the sample 3 as long as it is not too close to either the entrance slit 2 or the sample 3. The polarizer aperture 5A, the blocking aperture 11 and the focus mirror 4, or the space between mirror 4 and sample 3 in the path of sampling beam 9, are examples of possible locations where the apodizing filter could be located. The apodizing filter may also be placed in the path of radiation downstream from the sample, such as at aperture 6A, or between the fold mirror 7 and analyzer 8. Some of the possible positions for apodizing filter 50 are shown in dotted lines in FIG. 1A.

The signals actually detected by the detector 173 are those from a measurement spot on the surface of the sample 3, where the measurement spot is defined as the portion of the sample that is illuminated by the illumination system (2, 5, 5A, 11, 4) and is also within the detector's field of view (as defined by the collection optics 6A, 8, 69). An apodizer can be used to minimize the measurement spot size by either one of two techniques: by positioning it in the light path between the entrance slit (or pinhole) and sample in order to improve the illumination system's focusing resolution, or by placing it between the sample and detector to better limit the detector's field of view. (Both techniques can be applied in combination, using two apodizers. Or both techniques can be applied using a single apodizer if the illumination and collection systems share a common optical path, as in a normal-incidence microscope with epi-illumination.) Also, while the invention is illustrated as detecting reflected radiation, it is equally applicable to systems where transmitted radiation is detected.

In the above paragraph the definitions of "illuminated portion" and "detector's field of view" may need some qualification to identify specific boundaries circumscribing these regions on the sample. These boundaries can be defined using an encircled energy threshold criterion. For example, the illumination measurement spot can be defined in terms of a boundary enclosing some defined percentage (e.g. 99.5%) of the energy in the illumination distribution. The detector's field of view can be similarly defined by applying a thresholding criterion to the diffraction-limited inverse image of the detector's radiation-sensitive element (as imaged through the collection optics) on the sample surface. The threshold values used can be based on the detector's sensitivity limit; or other suitable criteria based on the system's measurement tolerance requirements can be used. In general, the measurement spot size definition may be dependent on the specific type of sample that is being measured and the type of measurement being performed. Any definition criteria that provide a useful means for quantifying the relative measurement performance of alternative design options can be used.

In the first preferred embodiment, the apodizing filter is placed just after the polarizer in place of the polarizer aperture 5A, and is a rectangular aperture with transmittance that varies with position in the horizontal dimension as illustrated in FIG. 2A and in the vertical dimension as illustrated in FIG. 2B. One technique that has been used to manufacture such apodizing filters is to make a spatially varying neutral density filter. A neutral density filter is traditionally manufactured by coating one side of a substrate with a thin metal coating. The substrate material is chosen for its good transmission properties over the range of wavelengths of interest. The thickness of the thin metal coating is chosen so as to control the fraction of the incident radiation that is transmitted. Most commonly, the metal coating is sputtered onto the substrate. In order to make a spatially varying neutral density coating, a mask is placed between the source of material for sputtering and the substrate being coated. Where the substrate is completely shielded by the mask, there will be no metal and thus high transmittance. Where the mask does not shield the substrate at all, the metal layer will be thickest and the transmittance lowest. Where the mask partially shadows the substrate, intermediate thicknesses of the metal coating, and hence intermediate transmittance fractions are generated. Extended, or complex shaped, regions of intermediate transmittance values (or transmittance values) can be generated by moving the substrate during the sputtering process, thus exposing larger regions of the substrate to less than the full sputtering dose.

For some applications, suitable filters may be available, such as Catalogue Number 1400 from Reynard Corporation, San Clemente, Calif.

In an alternative preferred embodiment, the aperture would be apodized only in one dimension, that direction corresponding to the high angle of incidence on the wafer (the vertical direction in the optical layout illustrated in FIG. 1A) since this is where the worst diffraction effects are.

FIG. 1B illustrates a different configuration of the polarizer assembly that can be used in another alternative preferred embodiment. In other words, the assembly in FIG. 1B may be used to replace the components in box 1B in FIG. 1A, to yield a second preferred embodiment. In this embodiment, the polarizer 5 would be placed between the output of the fiber 1 and the entrance slit 2. A lens or lenses 201, 202 would be used to focus the fiber 1 onto the entrance slit 2. The entrance slit would now have two functions: it is the source of light which is imaged on to the sample (the only function it performed in the first preferred embodiment), and it blocks the deviated light from the polarizer entering the rest of the system allowing more flexibility in the design of the rest of the optics. In this embodiment, the apodizing filter can now be placed anywhere between the entrance slit 2 and the focus mirror 4 or between the fiber 1 and the entrance slit 2, as long as it is not too close to either the entrance slit 2 or the fiber 1. For example, the apodizing filter could be placed at the blocking aperture 11, which now no longer has to block the deviated light from the polarizer. Another possibility would be to place the apodizing filter at the stop 203. In this case, the aperture stop for the focus mirror system should, preferably, be close to the conjugate plane of the stop 203. This can be most easily accomplished if it is arranged that the blocking aperture 11 and the stop 203 are at approximately conjugate positions of the lenses 201, 202. In some applications, aperture 11 may be replaced by a baffle or a set of baffles at 11.

It will be obvious to those skilled in the art, that this technique is not limited to the rotating polarizer ellipsometer described here, but can be applied to ref lectometers that use unpolarized light, and to other ellipsometer configurations. These ellipsometer configurations include rotating analyzer ellipsometers, rotating compensator ellipsometers, and ellipsometers that use photo-elastic modulators to modulate the ellipticity of the polarized light. The technique is not limited to applications that use a wide range of wavelengths, but works equally well when a single wavelength, such as from a laser, or a narrow range of wavelengths is used. This invention may also be used in systems employing microwaves to measure samples as well as measurement systems using infrared, visible and/or ultraviolet wavelengths.

It will also be obvious to those skilled in the art that apodization could be used to reduce diffraction effects in the area collected by the collection mirror 5, rather than, or in addition to, apodizing the area illuminated by the focus mirror 4. In order to simplify alignment and ensure stability in the collection optics, the detector's field of view can be made significantly larger than the illumination area on the sample. Alternatively, the illumination area can be made significantly larger than the detector's field of view in order to relax alignment and stability requirements in the illumination optics.

Although there are other techniques available for making spatially varying neutral density filters as disclosed above in the description of the prior art, this invention discloses a new and better method of manufacturing the apodizing filter. This method can manufacture very small filters, it gives very repeatable results, and it generates filters that work over wide ranges of wavelengths. In addition, this method of manufacturing spatially-varying neutral density filters can be used to create a wide range of different patterns and such filters could be used in applications other than those described here.

The new method for manufacturing a spatially varying neutral density filter disclosed here is to use a binary pattern comprising high transmittance areas and substantially opaque areas, rather than trying to fabricate areas of intermediate transmittance. (This is analogous to the half-toning process used in printing where black and white printed patterns are used to approximate intermediate gray scale levels.) Because such a pattern has many sharp discontinuities in its transmittance profile, it will scatter much of the incident radiation; but the scattered radiation can be eliminated by forming the binary pattern as a periodic structure, analogous to a diffraction grating, so that the scattered radiation is concentrated in distinct diffracted orders that can be blocked in either the illumination or collection optics. Thus only the zero-order radiation (i.e. the component of the transmitted radiation which is substantially undeviated by the apodizer) is sensed by the detector.

The apodizer's amplitude transmittance in the zero order is equivalent to its locally averaged transmittance, where the "locally averaged transmittance" is a quantity which varies as a function of position on the apodizer, and which is defined in terms of a specific spatial frequency cutoff in the apodizer function's two-dimensional spatial frequency spectrum. The frequency cutoff can be defined as follows: any pair of geometric rays, one originating from the illumination source and transmitting through any particular point on the apodizer and the second originating from the same apodizer point and transmitting through the measurement spot ( as defined above), will have some deviation angle at the apodizer, and the frequency cutoff is the ratio of the largest such angle (in radians) to the minimum wavelength sensed by the detector. Provided that the periodicity of the apodizer pattern is sufficiently small the large discontinuities in the transmittance profile will be absent in the locally averaged transmittance, and the apodizer can be designed so that the locally averaged transmittance has the form of an apodization function which mitigates the diffraction tails in the zero order.

The periodic pattern comprises zones of high transmittance and substantially opaque zones defined by repeating feature elements that are distributed on a regular grid. The shape of the elements is not critical, but objects of simple geometry such as lines, squares, hexagons, triangles, octagons or circles are preferred. (For ellipsometric applications patterns having square symmetry would be preferred in order to ensure that the apodizer does not substantially affect the radiation's polarization state.) The apodizer's locally averaged transmittance $T_{avg}$ at any particular point on the apodizer is substantially equivalent to:

$$T_{avg}=T_{low}+CAF*(T_{high}-T_{low})$$

where $T_{high}$ and $T_{low}$ are the high and low binary transmittance values and CAF is a "clear area fraction," defined as the fraction of area on the grid cell at the designated point that has high transmittance. The size of the feature elements, or their periodicity, or both, would vary over the apodizer so that the locally averaged transmittance function matches a desired apodization function. Typically, the periodicity would first be selected to optimally control stray light in the diffracted orders (the periodicity would preferably be uniform over the apodizer), and then the feature size distribution would be designed to produce the desired apodization function.

FIG. 3 illustrates how it is possible to make an apodizing filter by alternating lines or strips of high and low transmittance. (Shaded areas in FIGS. 3 and 4 represent low-transmittance regions; high transmittance regions are unshaded.) In this figure, the strip width and spacing are greatly exaggerated in size for clarity. Dark strips of different widths are laid down centered on a regular grid, such as a square grid. Therefore, the spacing d between the center lines of adjacent strips is substantially the same for all the alternating vertical and horizontal strips. The strips vary in width, from the grid spacing minus the minimum feature size (for example, a maximum line width of 3 μm on a grid spacing of 3.6 μm) down to the minimum feature size (for example, 0.6 μm). In this example the minimum clear area fraction along the apodizer's horizontal and vertical center lines 199A, 199B (e.g. the top center portion 198) would be 0.6/3.6=17% so there will be a small discontinuity in transmittance at the boundary between the apodized area and the surrounding opaque material of the aperture. Where apodizing is needed only in the vertical direction as indicated above, FIG. 3 needs to be modified by eliminating the vertical clear and substantially opaque strips and retaining only the horizontal ones.

One potential problem with the above design is that some regions of the apodizing filter do not have symmetry between the horizontal and vertical directions. For example, the top center portion 198 of the filter in FIG. 3 has long horizontal transparent strips but only short vertical strips. This might affect the polarization state of transmitted radiation. This could be a problem for those applications (such as ellipsometry) that use polarized light. However, there is another preferred embodiment that can avoid this potential problem and also reduce the discontinuity in intensity described in the previous paragraph. This preferred embodiment is illustrated in FIG. 4. In FIG. 4, the locally averaged transmittance function follows the profile shape of FIG. 2B in the horizontal direction, and of FIG. 2A in the vertical direction.

In this embodiment of the technique, the inner or central part of the filter consists of dark (substantially opaque) squares of varying size and the outer or peripheral part consists of light (high transmittance) squares of varying size. The squares are placed with their centers on a diagonal grid (45 degrees to the squares) of equal spacing in each dimension. The centers of the light squares are displaced by half the grid spacing relative to the dark squares, so that there is no discontinuity in the pattern at the transition boundary between light and dark squares where the light and dark squares are equal in area. The size of the squares varies from the smallest that can be reliably manufactured (for example, 0.6 μm), to a maximum size which is half the grid period. For this pattern, the discontinuities in the clear area fraction due to feature size limitations are insignificant because square (as opposed to line) features are used to define the areas of both high and low locally averaged transmittance. For example, for a 3.6 μm grid spacing and 0.6 μm minimum feature size, the maximum clear area fraction is $1-(0.6/3.6)^2=97\%$, and the minimum clear area fraction is $(0.6/3.6)^2=3\%$, compared to 17% for the previous example (FIG. 3). Furthermore, since the small scale structure of the filter has square symmetry, it follows that the polarization state of the forward transmitted light is unaffected by the apodizing filter.

The radiation in the first diffracted order from the aperture is deviated through an angle in radians that is given, to close approximation, by the wavelength divided by the grid period. The shortest wavelengths are always deviated the least. In the first preferred embodiment disclosed here, it is desirable to make the deviation of the radiation at least twice the deviation of the unwanted polarization from the polarizer so that the first order diffracted light from the unwanted polarization does not overlap the straight-through beam from the wanted polarization. In this embodiment, the deviation of the unwanted polarization at the shortest wavelength is two degrees, so the desired minimum deviation from the diffraction pattern of the apodizer is four degrees (equals 0.07 radians). If the shortest wavelength to be used in the instrument is 185 nm, then the spacing of the grid should be $0.185/0.07=2.6$ μm. In the pattern illustrated in FIG. 4, the diagonal (i.e., the shortest) grid spacing should be equal to this value.

In some of the alternative preferred embodiments, the apodizing filter does not also need to separate the deviated and undeviated radiation from the polarizer. In such cases, the grid spacing can be selected just on the requirement that the first and higher diffracted orders from the pattern will not enter the detector.

In reference to FIG. 4, the apodizing filter 200 has an effective aperture comprising essentially the minimal convex closed curve circumscribing the clear areas and excluding the entirely dark areas. The filter has a center or central portion 205 inside boundary 204 and an edge or peripheral portion 206 outside the boundary. In the center portion 205, the pattern of the filter comprises dark (i.e. substantially opaque) squares on a clear background. In the peripheral portion, the pattern of the filter comprises clear squares on a dark background. At or near the boundary 204, the corners of the clear and substantially opaque squares touch at their corners. Since the transition from substantially opaque to clear squares pattern occurs where the clear area fraction is 50% on both sides of the transition, there is no discontinuity at the boundary. A radial line segment is one that travels between approximately the center of the central portion and the effective aperture boundary, such as lines 210 shown in FIG. 4. In the preferred embodiment, the locally averaged transmittance function of filter 200 in the substantially opaque areas is less than 10% of the incident radiation and that of the clear areas is at least twice that of the substantially opaque areas. In the embodiment of FIG. 4, filter 200 apodizes by means of a locally averaged transmittance function that varies between high transmittance at the center and substantially opaque at the edge over a distance that is a significant fraction of the linear dimensions of the effective aperture. Specifically, the locally averaged transmittance function of the filter 200 varies substantially monotonically preferably by less than 50% of the transmittance of the clear areas over any 10% of the length of any radial line segment, such as 210. In filter 200 of FIG. 4, the locally averaged transmittance function in a central part 212 of the center portion has a substantially constant maximum value.

The substantially opaque and clear squares are centered at points of periodic square grids at substantially 45 degrees to the squares. The clear squares are centered at points of a first periodic square grid and the substantially opaque squares are centered at points of a second periodic square grid, wherein the first and second grids have two dimensions and are displaced by half spacing along the two dimensions. In the preferred embodiment, the square size distribution over the aperture is defined so that the locally averaged transmittance function over any horizontal line in FIG. 4 has the shape shown in FIG. 2A, and over any vertical line has the shape shown in FIG. 2B. More specifically, defining the horizontal coordinate as X and the vertical coordinate as Y, the clear area fraction CAF[X,Y], as a function of X and Y, is separable in the two coordinates:

$$CAF[X,Y]=CAF[X]CAF[Y]$$

where the function CAF[X] has the form illustrated in FIG. 2A and CAF[Y] is as illustrated in FIG. 2B. In practice, this prescription may have to be modified slightly to accommodate the feature size limitations of the manufacturing process. For example, if the feature size limitation dictates that the clear area fraction be in the range $0.03 \leq CAF < 0.97$, then values that are in the range of $0 \leq CAF \leq 0.015$ (according to the above prescription) are replaced by zero; values in the range $0.015 \leq CAF \leq 0.03$ are replaced by 0.03; values in the range of $0.97 \leq CAF \leq 0.985$ are replaced by 0.97, and values in the range of $0.985 \leq CAF \leq 1$ are replaced by 1.

The extension of this technique to use other geometric shapes such as rectangles will be obvious to those skilled in the art.

Patterns such as those described above can readily be manufactured using electron beam lithography (see, for example, *Silicon Processing for the VLSI Era,* S. Wolf and R. N. Tauber, Lattice Press, pp. 482–483, 493504, 1986) which is a well-known technique for making lithography masks for semiconductor manufacture. A lithography mask consists of patterns made in a material that is substantially opaque (usually a metal such as chrome or chromium) on a substrate of some transmissive material such as glass, quartz, fused silica or sapphire. The patterns are generated by a computer program and usually consist of lines, squares rectangles, hexagons, triangles, octagons or circles and other geometric shapes appropriate for semiconductor circuit designs.

It will also be obvious that optical lithography techniques could be used instead of electron-beam lithography. Practical optical lithography cannot typically produce features as small as those produced by electron-beam lithography, but optical lithography is faster and cheaper and so may be more appropriate for applications that are less critical in their requirements (such as applications working only with longer wavelengths).

In many cases, the mask made by electron beam lithography can be cut to the required size and used directly as the apodizing filter. If the substrate of the mask does not have good transmittance at some of the wavelengths used, then the pattern from the mask could be transferred photolithographically to a more suitable substrate. Using photolithographic transfer from the electron-beam lithography mask also makes the filters much less expensive to fabricate and so is also appropriate in cases where the slight loss in quality is not critical.

FIGS. 5A–5C illustrate how multiple apodizing filters can be fabricated on a single mask. It will be obvious to those skilled in the art, that this technique is not limited to generate simple patterns with low transmittance on the outside and high transmittances in the center, as required for this apodization application, but can make almost arbitrary patterns of varying transmittance.

It will be obvious to those skilled in the art that one or both surfaces of the filter made this way may be coated with an anti-reflection coating 252 of an appropriate design, such as shown in FIG. 6. As shown in FIG. 6, the coating 252 is formed on the chrome layer 254 which is formed on the quartz substrate 256.

A more detailed description of the process for making an apodizing filter resembling that shown in FIG. 4 is set forth in Appendix A attached hereto and made a part of this application.

While the invention has been described by reference to various embodiments, it will be understood that different modifications and changes may be made without departing from the scope of the invention which is to be defined only by the appended claims and their equivalents.

What is claimed is:

1. A method for measuring a sample, including the steps of:

focusing radiation from a source into a sampling beam directed at the sample;

detecting radiation of the sampling beam that has been modified by a portion of the sample, said portion defining a measurement spot; and apodizing radiation that is from the source, wherein said detecting step detects radiation that has been apodized in the apodizing step, to reduce size of the measurement spot.

2. The method of claim 1, further comprising polarizing radiation from the source, said focusing step focusing said polarized radiation to provide said sampling beam.

3. The method of claim 2, further comprising passing radiation from the source through an entrance slit or pinhole prior to focusing such radiation into said sampling beam.

4. The method of claim 2, said radiation from the source focused in the focusing step having a broad wavelength band, wherein said sample modifies said sampling beam, said detecting step including:

separating the modified sampling beam from the sample into wavelength components;

detecting the wavelength components to provide outputs; and processing the outputs to determine changes of polarized state in amplitude and phase caused by the sample.

5. The method of claim 4, said focusing step focusing radiation to the sample at an oblique incidence angle by means of reflective optics.

6. The method of claim 4, said incidence angle being in a range from about 63.5 degrees to about 80.5 degrees.

7. The method of claim 4, said radiation having wavelengths in a range including infrared, visible and ultraviolet wavelengths.

8. The method of claim 4, said radiation having wavelengths in a range including microwave wavelengths.

9. The method of claim 1, said apodizing step apodizing radiation modified by the sample.

10. The method of claim 1, said apodizing step apodizing radiation of the sampling beam.

11. The method of claim 1, said focusing step focusing radiation that has been apodized in the apodizing step.

12. The method of claim 1, said measurement spot being less than about 50 by 30 microns.

13. The method of claim 1, wherein said focusing focuses radiation of a plurality of wavelengths into said sampling beam, and said apodizing apodizes radiation of said plurality of wavelengths.

14. The method of claim 1, wherein said focusing focuses broadband radiation into said sampling beam, and said apodizing apodizes broadband radiation.

15. The method of claim 1, said sampling beam having a diffraction point spread function, wherein said apodizing reduces tails of the point spread function relative to that of a clear, unapodized aperture.

16. The method of claim 1, wherein said apodizing causes amplitude of the radiation that is modified to vary smoothly between a maximum and a minimum.

17. The method of claim 1, wherein said detecting detects changes of polarized state of said radiation.

18. An apparatus for measuring a sample, including:

a source which emits radiation;

means for focusing radiation from the source into a sampling beam to the sample;

means for detecting radiation of the sampling beam that has been modified by a portion of the sample, said portion defining a measurement spot; and means for apodizing radiation that is from the source, wherein said detecting means detects radiation that has been apodized by the apodizing means, to reduce size of the measurement spot.

19. The apparatus of claim 18, wherein said focusing means focuses radiation of a plurality of wavelengths into said sampling beam, and said apodizing means apodizes radiation of said plurality of wavelengths.

20. The apparatus of claim 18, wherein said focusing means focuses broadband radiation into said sampling beam, and said apodizing means apodizes broadband radiation.

21. The apparatus of claim 18, said sampling beam having a diffraction point spread function, wherein said apodizing means reduces tails of the point spread function relative to that of a clear, unapodized aperture.

22. The apparatus of claim 18, wherein said apodizing means causes amplitude of said radiation that is modified to vary smoothly between a maximum and a minimum.

23. The apparatus of claim 18, wherein said detecting means detects changes of polarized state of said radiation.

24. The apparatus of claim 18, further comprising a polarizer that polarizes radiation from the source to produce a polarized beam, said focusing means focusing said polarized beam or a beam derived therefrom to provide said sampling beam.

25. The apparatus of claim 24, said apodizing means including at least a first apodizing filter, said filter filtering said polarized beam.

26. The apparatus of claim 25, said apodizing means including a second apodizing filter filtering unpolarized radiation from the source prior to polarization by the polarizer.

27. The apparatus of claim 25, further including an entrance slit or pinhole passing radiation originating from the source to the focusing means.

28. The apparatus of claim 27, further comprising:
    at least one lens focusing radiation from the source through the polarizer to the entrance slit or pinhole, said at least one lens having conjugate planes;
    two aperture stops at the two conjugate planes.

29. The apparatus of claim 28, said first apodizing filter being proximate to the aperture stop between the polarizer and the focusing means.

30. The apparatus of claim 25, said focusing means including reflective optics that reflectively focuses the sampling beam to the measurement spot on the sample, said detector means providing an output, said apparatus further comprising means for processing the detector means output to determine changes of polarization state in amplitude and phase caused by the sample.

31. The apparatus of claim 24, wherein the apodizing means is positioned to apodize radiation from the polarizer to the sample.

32. The apparatus of claim 24, wherein the apodizing means is positioned to apodize radiation from the source to the polarizer.

33. The apparatus of claim 24, wherein the apodizing means is positioned to apodize radiation modified by the sample.

34. The apparatus of claim 24, further including an entrance slit or pinhole passing radiation from the source to the focusing means.

35. The apparatus of claim 24, wherein the apodizing means is positioned to apodize radiation from the entrance slit or pinhole to the sample.

36. The apparatus of claim 34, wherein the apodizing means is positioned to apodize radiation from the source to the entrance slit or pinhole.

37. The apparatus of claim 8 said apodizing means including a plate having a two dimensional pattern of alternating high transmittance areas and substantially opaque areas, said pattern having a locally averaged transmittance function that is an apodizing function.

38. The apparatus of claim 37, said plate having a center portion and an edge portion surrounding said center portion, said filter having an effective area for filtering radiation, said effective area including the center portion and at least a part of the edge portion, said locally averaged transmittance function varying substantially monotonically by less than 50% of said high transmittance over any 10% of the length of any radial line.

39. The apparatus of claim 37, said locally averaged transmittance function being such that it has a substantially constant maximum value in a central part of the center portion of the plate.

40. The apparatus of claim 37, said pattern comprising a one or two dimensional diffraction grating with lines having a spatially varying structure, wherein the grating apodizes radiation passing therethrough in direction(s) transverse to the grating lines.

41. The apparatus of claim 37, wherein said pattern is a two dimensional grating comprising substantially opaque squares or rectangles on a clear background, or clear squares or rectangles on a substantially opaque background, with spatially varying square or rectangular dimensions.

42. The apparatus of claim 18 said apodizing means including a spatially varying neutral density filter.

43. An apodizing filter comprising a plate having a two dimensional pattern of alternating high transmittance areas and substantially opaque areas, said pattern having a locally averaged transmittance function that is an apodizing function.

44. The filter of claim 43, said plate comprising:
    a transparent substrate; and
    a layer of substantially opaque material on or near the substrate, said layer defining said substantially opaque areas.

45. The filter of claim 44, wherein said substrate comprises quartz and said opaque material comprises chrome.

46. The filter of claim 43, said plate having a center portion and an edge portion surrounding said center portion, said filter having an effective area for filtering radiation, said effective area including the center portion and at least a part of the edge portion, said locally averaged transmittance function varying substantially monotonically by less than 50% of said high transmittance over any 10% of the length of any radial line.

47. The filter of claim 43, said locally averaged transmittance function being such that it has a substantially constant maximum value in a central part of the center portion of the plate.

48. The filter of claim 43, said pattern comprising a one or two dimensional diffraction grating with lines having a spatially varying structure, wherein the grating apodizes radiation passing therethrough in direction(s) transverse to the grating lines.

49. The filter of claim 48, wherein the grating comprises substantially opaque strips of varying widths, said strips having center lines, and wherein the spacings between the center lines of pairs of adjacent strips are substantially the same.

50. The filter of claim 43, wherein said pattern is a two dimensional grating comprising substantially opaque squares or rectangles on a clear background, or clear squares or rectangles on a substantially opaque background, with spatially varying square or rectangular dimensions.

51. The filter of claim 50, said grating comprising substantially opaque squares or rectangles on a clear background over a first portion of the plate and clear squares or rectangles on a substantially opaque background over a second portion of the plate.

52. The filter of claim 51, said first portion comprising a central portion of the plate and the second portion comprising a peripheral portion of the plate.

53. The filter of claim 52, said grating comprising substantially opaque squares on a clear background, or clear squares on a substantially opaque background, wherein at a boundary between the central and peripheral portions, the opaque and clear squares touch at their corners.

54. The filter of claim 50, said grating comprising substantially opaque squares on a clear background, or clear squares on a substantially opaque background, wherein the squares are centered at points of periodic square grids at substantially 45 degrees to the squares.

55. The filter of claim 54, wherein the clear squares are centered at points of a first periodic square grid and the substantially opaque squares are centered at points of a second periodic square grid, wherein the first and second grids have two dimensions and are displaced by half spacing along the two dimensions.

56. The filter of claim 43, wherein said pattern is a two dimensional grating comprising substantially opaque octagonal, circular, triangular or hexagonal regions on a clear background, or clear octagonal, circular, triangular or hexagonal regions on a substantially opaque background, with spatially varying dimensions of the regions.

57. The filter of claim 43, said sample modifying the sampling beam to derive a modified beam, wherein the sampling beam and the modified beam define an incidence plane, said locally averaged transmittance function varying in directions parallel to the incidence plane but having a substantially constant value in directions normal to the incidence plane.

58. The system of claim 43, said areas of high transmittance transmitting at least twice the amount of radiation transmitted by substantially opaque areas.

59. A radiation imaging system with improved resolution, comprising:
    means for focusing radiation from an object surface to a focal surface;
    an apodizer positioned in a radiation path between the object surface and the focal surface, said apodizer having a two dimensional pattern of alternating high transmittance areas and substantially opaque areas, said pattern having a locally averaged transmittance function that is an apodizing function; and
    a filter in the radiation path following the apodizer, said filter blocking scattered radiation that is generated by, or passed by, the apodizer;
    wherein radiation transmitted through the apodizer and the filter along said radiation path comprises image radiation, said image radiation having a diffraction point spread function; wherein the apodizer reduces tails of the point spread function relative to that of a clear, unapodized aperture.

60. The system of claim 59, said filter blocking first and higher order diffracted radiation and passing zero order diffracted radiation passed by the apodizer.

61. The system of claim 60, said filter being a clear aperture, a baffle or a set of baffles.

62. A method for measuring ellipsometric parameters of a sample, including the steps of:
    focusing polarized broadband radiation from a source into a sampling beam directed at the sample;
    separating into wavelength components radiation of the sampling beam that has been modified by a portion of the sample, said portion defining a measurement spot;
    detecting the wavelength components to provide outputs; and
    determining from the outputs changes of polarized state caused by the sample; and
    apodizing radiation that is from the source, wherein said detecting step detects radiation that has been apodized in the apodizing step, to reduce size of the measurement spot.

63. The method of claim 62, wherein said apodizing apodizes a plurality of wavelength components of said radiation.

64. The method of claim 62, said sampling beam having a diffraction point spread function, wherein said apodizing reduces tails of the point spread function relative to that of a clear, unapodized aperture.

65. The method of claim 62, wherein said apodizing causes amplitude of said radiation that is modified by the sample to vary smoothly between a maximum and a minimum.

66. An apparatus for measuring ellipsometric parameters of a sample, including the steps of:
    means for focusing polarized broadband radiation from a source into a sampling beam directed at the sample;
    means for separating into wavelength components radiation of the sampling beam that has been modified by a portion of the sample, said portion defining a measurement spot;
    a detector detecting the wavelength components to determine changes of polarized state caused by the sample; and
    an apodizer that apodizes radiation that is from the source and that is detected by the detector to reduce size of the measurement spot.

67. The method of claim 66, wherein said apodizer apodizes a plurality of wavelength components of said radiation.

68. The method of claim 66, said sampling beam having a diffraction point spread function, wherein said apodizer reduces tails of the point spread function relative to that of a clear, unapodized aperture.

69. The method of claim 66, wherein said apodizer causes amplitude of said radiation that is modified by the sample to vary smoothly between a maximum and a minimum.

* * * * *